United States Patent [19]

Jin et al.

[11] Patent Number: 5,965,197
[45] Date of Patent: Oct. 12, 1999

[54] ARTICLE COMPRISING FINE-GRAINED SOLDER COMPOSITIONS WITH DISPERSOID PARTICLES

[75] Inventors: Sungho Jin, Millington; Thomas Henry Tiefel, North Plainfield, both of N.J.

[73] Assignee: Lucent Technologies Inc., Murray Hill, N.J.

[21] Appl. No.: 09/187,885

[22] Filed: Nov. 6, 1998

Related U.S. Application Data

[62] Division of application No. 08/753,856, Dec. 3, 1996.

[51] Int. Cl.$^6$ ....................................................... B05D 1/12
[52] U.S. Cl. ........................... 427/180; 427/216; 427/217
[58] Field of Search ..................................... 427/435, 216, 427/180, 369, 190, 191, 217, 383.1

[56] References Cited

U.S. PATENT DOCUMENTS

| | | | |
|---|---|---|---|
| 4,710,348 | 12/1987 | Brupbacher et al. | 420/129 |
| 4,738,389 | 4/1988 | Moshier et al. | 228/198 |
| 4,751,048 | 6/1988 | Christodoulou et al. | 420/129 |
| 5,066,544 | 11/1991 | Betrabet et al. | 428/614 |
| 5,122,418 | 6/1992 | Nakane et al. | 424/401 |
| 5,134,039 | 7/1992 | Alexander et al. | 428/614 |
| 5,346,775 | 9/1994 | Jin et al. | 428/614 |
| 5,516,550 | 5/1996 | Kikuchi et al. | 427/180 |
| 5,656,087 | 8/1997 | Kikuchi et al. | 118/418 |

FOREIGN PATENT DOCUMENTS 97309249  2/1998  European Pat. Off. .

OTHER PUBLICATIONS

Davies, G.J.. et al., "Superplasticity: A Review", *Journal of Materials Science*, pp. 1091–1102 (1970).

Marshall, J.L. et al., "Composite Solders", *IEEE Transaction on Components, Hybrids, and Manufacturing Technology*, vol. 14, No. 4, pp. 698–702 (1991).

Morris, J.W. et al., "Toward New Solders with Improved Fatigue Resistance", *Solder Mechanics*, pp. 239–170 (1991).

Inoue, H. et al., "Pb–Sn Solder for Die Bondibg of Silicon Chips", *IEEE Trans. On Components Hybrids, and Manufacturing Technology*, vol. CHMT–9, No. 2, pp. 190–194 (1986).

*Primary Examiner*—Diana Dudash
*Assistant Examiner*—Paul D. Strain
*Attorney, Agent, or Firm*—Scott J. Rittman

[57] ABSTRACT

New solder compositions having enhanced mechanical properties are disclosed. Relatively inert particles having a diameter of 2000 nm or less are dispersed in a solder material having an average grain size of 500 nm or less to produce such solder compositions. The dispersed particles act as physical barriers substantially impeding the motion of grain boundaries and inhibiting grain growth during thermal and stress cycling which substantially inhibits coarsening. As a consequence, the solder composition exhibits an advantageous level of superplasticity that is substantially resistant to joint failure. Methods for forming articles using such solder compositions is also disclosed.

8 Claims, 5 Drawing Sheets

ARTICLE COMPRISING FINE-GRAINED SOLDER COMPOSITIONS WITH DISPERSOID PARTICLES

This patent application is a division of pending U.S. patent application Ser. No. 08/753,856 filed Dec. 3, 1996.

FIELD OF THE INVENTION

The invention relates to solder compositions containing dispersoid particles and methods of forming articles using such solder compositions.

BACKGROUND OF THE INVENTION

Modern electronic products including, for example, consumer electronics, computers, telecommunication equipment and automobile electronics require electrical device interconnection and packaging. Typically, solder joints are used to interconnect packaged or unpackaged integrated circuit devices to printed circuit boards or substrates. Conventional methods for forming such solder joints include wave soldering or the use of solder paste. Reduction in the size and cost of electronic component has been a general goal of the electronic industry.

However, the reduction in electronic component size generally requires an increase in the density of component interconnections and a reduction in the size and height of corresponding solder joints. Stress cycling due to thermal expansion mismatch between two interconnected components and thermal cycling during the operation of electronic components causes local recrystallization and microstructure coarsening in associated solder joints. This coarsening in combination with the increased shear strain experienced by smaller solder joints increases the likelihood of thermal fatigue crack growth and solder joint failures. Such behavior has been observed with conventional Pb—Sn solders as described in D. R. Frear et al., *Solder Mechanics,* ch. 6, p. 239 (1990), which is incorporated by reference herein, and has undesirably limited the reduction in solder joint size and corresponding electronic component size.

The previously cited Solder Mechanics book and Inoue et al, "Pb—Sn Solder for Die Bonding of Silicon Chips", *IEEE Trans. on Components, Hybrids, and Manufacturing Technol.,* vol. 9, p. 190–194 (1986), have recognized that solders with fine grains, such as grains having a diameter in the range of 1 to 5 μm are somewhat resistant to coarsening and correspondingly provide a somewhat improvement in the long term reliability of solder joints. However, conventional solders with such fine grains are not sufficiently stable, and still experience undesirable coarsening from thermal and stress cycling during the useable life of typical electronic components.

As a result, a recognized need exists for solder joints that are substantially resistant to coarsening and fatigue from thermal and stress cycling.

SUMMARY OF THE INVENTION

The invention is embodied in articles that comprise new solder compositions with enhanced mechanical properties. More specifically, the invention is based on the realization that relatively inert particles having an average diameter in the range 5 nm to 2000 nm can be dispersed within a solder material having an average grain diameter of 500 nm or less to act as physical barriers that substantially impede the motion of grain boundaries and inhibit grain growth. As a consequence, coarsening during thermal and stress cycling is substantially inhibited. Moreover, the solder composition exhibits an advantageous level of superplasticity that is substantially resistant to joint failure.

It is possible to employ Pb—Sn solder compositions or lead-free solders such as, for example Sn—Ag, Bi—Sn and In—Ag solders, for the solder material. Solder joints formed according to the invention are generally at least 30% to 50% more resistant to stress failure than corresponding conventional solder joints without such dispersed particles and correspondingly generally having a longer fatigue life of at least 50% to 100%.

In accordance with another aspect of the invention, it is advantageous to form solder joints using the advantageous solder composition in a manner that substantially inhibits segregation of the dispersoid particles from the solder material. Such methods include, for example, the use of a solder paste or the formation of corresponding solder bumps using vacuum deposition, dip-coating or employing laser melting or pressure bonding techniques.

Additional features and advantages of the invention will become more readily apparent from the following detailed description and accompanying drawings.

DETAILED DESCRIPTION

The invention is embodied in articles that comprise a new solder composition that possess enhanced mechanical properties. Such articles include components, packaged or unpacked electrical devices, printed circuit boards or substrates interconnected by at least one solder joint having a solder composition according to the invention. A solder composition according to the invention includes dispersoid particles having an average diameter in the range 5 nm to 2000 nm dispersed within a solder material having an average grain diameter 500 nm or less. In such a composition, the dispersoid particles act as physical barriers substantially impeding the motion of grain boundaries and inhibiting grain growth. As a consequence, coarsening during thermal and stress cycling is substantially inhibited. Moreover, the resulting solder composition exhibits an advantageous level of superplasticity that is substantially resistant to joint failure.

It is critical that the dispersoid particles be substantially inert with no or substantially little liquid- or solid-solubility in the solder material in order for the particles to advantageously act as physical barriers inhibiting grain growth. Accordingly, numerous different types of solder materials and dispersoid particles are useable in accordance with the invention. The use of Pb—Sn solders in the following discussion is for illustration purposes only and is not meant to be a limitation of the invention. It is also possible to use lead-free solders for the solder materials including, for example, Sn—Ag, Bi—Sn and In—Ag based eutectic and non-eutectic solders.

Figure 1:
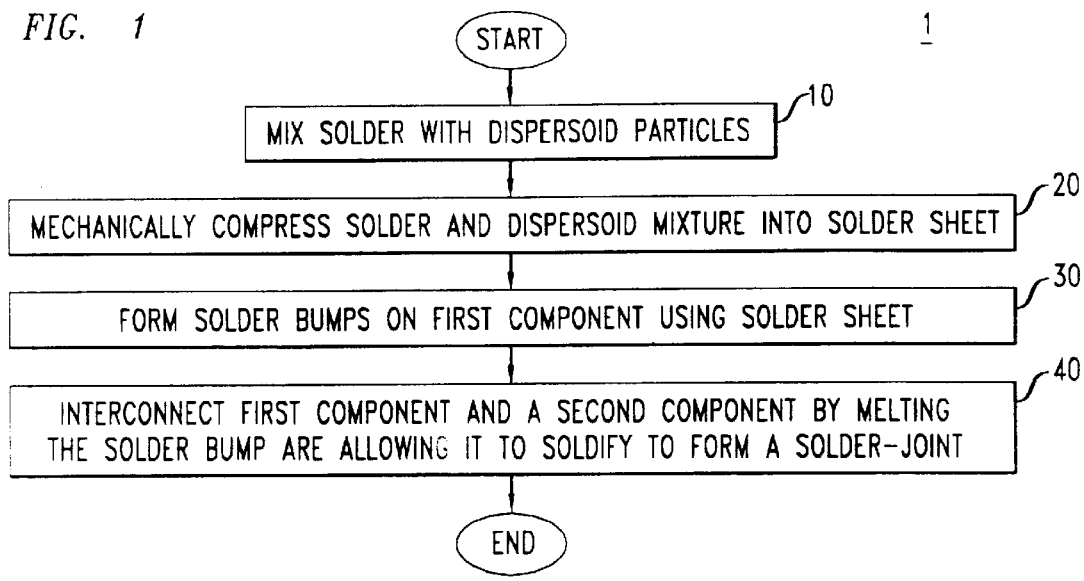
FIG. 1 is a flow diagram illustrating an exemplary method for forming dispersoid-containing solder joints according to the invention employing a powder mixing technique.
Figure 2A:
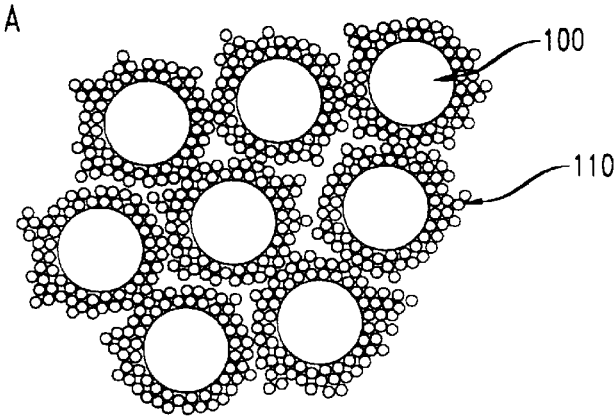
FIGS. 2A, 2B and 2C are schematic diagrams illustrating solder material and dispersoid interaction during particular steps of the method shown in FIG. 1.
Figure 2B:
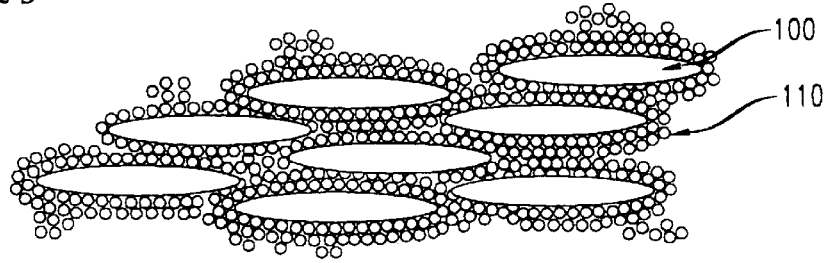
Figure 2C:
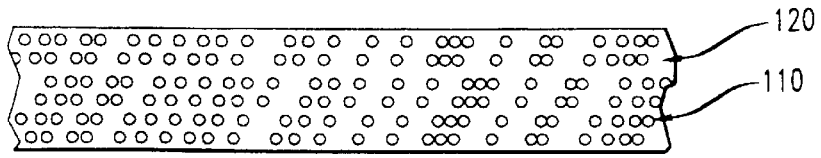
Figure 7:
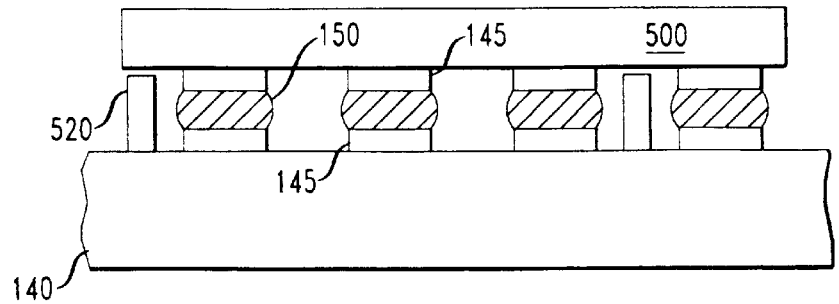
FIG. 7 is a schematic diagram illustrating an exemplary article according to the invention employing interconnect spacers.

An exemplary process 1 for forming an articles using a solder and dispersoid composition in accordance with the invention is shown in FIG. 1. In the process 1, a Pb—Sn solder powder is mixed with dispersoid particles in step 10. FIG. 2A provides a representation of resulting mixture with the solder powder and dispersoid particles identified with reference numbers 100 and 110, respectively. Then, in step 20 of FIG. 1, the mixed composition is mechanically compressed to achieve plastic deformation of the solder particles 110 as shown in FIG. 2B to produce a resulting sheet 120 of the solder composition, as shown in FIG. 2C. The produced solder composition sheet 120 is then used, in step 30 of FIG. 1, to form solder bumps 130 on a first component 140, shown in FIGS. 4 and 5. Suitable methods for forming such solder bumps 130 is described in greater detail below with regard to FIGS. 3 and 4. Then, in step 40 of FIG. 1, a solder joint 150 is formed between the first component 140 and a second component 160 as shown in FIG. 7 which is also described below.

In the mixing step 10 of FIG. 1, an exemplary composition for the solder powder 100 is 30% to 98% by weight Pb and 2% to 70% by weight Sn. It is further possible to include up to 20% by weight of a metal such as, for example, Bi, Ag, Sb, Cu, Au, Ni, In, Zn. The solder powder 100 should have an average particle diameter substantially in the range of 10 $\mu$m to 1000 $\mu$m in order to provide adequate dispersion of the dispersoid particles. It is possible to determine the average diameters of solder grains and dispersoid particles by a conventional linear intercept technique in metallography.

Solder particles 100 having an average diameter less than 10 $\mu$m is less desirable because their large surface area tends to be susceptible to surface oxidation. Also, submicron-sized particles tend to be pyrophoric. Very fine toxic solder powders such as Pb-containing solder are also discouraged because of safety considerations in handing such powders. In contrast, the use of solder particles 100 having diameters in excess of 1000 $\mu$m is not desirable because of the extensive plastic deformation of the solder powder required makes mixing difficult to adequately disperse the substantially smaller dispersoid particles. Further, it is more advantageous to employ solder powders having average particle diameters in the range of 20 $\mu$m to 200 $\mu$m based on such considerations.

The material for the relatively inert dispersoid particles 110 can, for example, be stable oxides such as $TiO_2$, $ZrO_2$, $Al_2O_3$, and rare earth oxides including $Y_2O_3$, $CeO_2$, $Sm_2O_3$, $La_2O_3$ and $Dy_2O_3$. Such oxides are referred to as stable oxides because they do not substantially reduce or decompose in environments in which solder joints are formed or used. It is also possible to use lead oxides such as PbO, $PbO_2$ and $Pb_2O_3$, however, since lead oxides share a common element, Pb, with the Pb—Sn solder material, coarsening of such dispersoid material can occur because of the mobility in the Pb in the dispersoid composite. In addition, fine particles of corresponding stable nitrides such as TiN, ZrN, AlN and rare earth nitrides, or carbides such as TiC, ZrC, HfC can also be used as the dispersoid material 110.

The dispersoid particles 110 impede the motion of grain boundaries and inhibit grain growth in the resulting solder composition. In order to provide such properties, the dispersoid particles 110 should have average diameters in the approximate range of 5 nm to 2000 nm. However, the use of particles 110 having an average diameter of at least approximately one to two orders of magnitude smaller than the average particle diameter of the solder powder 100 facilitates advantageous coating of the surface of the solder particles 100 with the dispersoid particles 110 during the mixing step 10. Such coating further facilitates an enhanced dispersion of the particles 110 during a subsequent plastic deformation step. Accordingly, it is advantageous to use dispersoid particles 110 having average diameters less than approximately 100 to 500 nm to provide such advantageous dispersion for Pb—Sn solder powders. A sufficient amount of dispersoid to provide such properties for Pb—Sn solders is in the range of 0.5% to 20% of the volume of the resulting solder composition and more advantageously in the range of 1% to 10%.

In step 10 of FIG. 1, it is possible to mix the dispersoid particles 110 and the solder powder 100 of FIG. 2 by conventional dry powder mixing techniques. However, enhanced dispersing of the particles 110 is achievable using a wet mixing procedure. Wet mixing also reduces health and environmental risks associated with inadvertent breathing of toxic Pb-containing solder and fine dispersoid particles is achieved using a wet mixing procedure. Numerous liquids can be employed for performing wet mixing such as water. However, the use of relatively volatile liquids such as alcohol and acetone facilitate drying of the composition after mixing.

In order to substantially avoid segregation of dispersoid particles 110 from the solder material 100 during mixing or subsequent soldering operations, it is advantageous to use dispersoid particulars 110 with a similar density to the solder material. In this manner, segregation due to floating or sinking of the dispersoid particles in the solder composition due to gravity can be substantially prevented. Accordingly, it is advantageous to employ dispersoid particles 110 having a density within 10% of the density of the solder material 100. To even further enhanced protection from segregation, it is desirable to use dispersoid particles and solder materials having densities that differ by no more th an 5% and more desirably by no more than 2%.

For example, it is advantageous to use a solder material 100 such as eutectic solder alloy of approximately 37% by weight Pb and 63% by weight Sn and having a density of approximately 8.34 g/cm$^3$ with dispersoid particles of, for example, stable rare-earth oxides such as $Dy_2O_3$ or $Ho_2O_3$ having approximate densities of 8.17 g/cm$^3$ and 8.41 g/cm$^3$, respectively. Further, particular mixture ratios of rare-earth oxides can advantageously be synthesized to substantially match the density of a solder material. For instance, a mixture having a ratio of 55:45 of $Sm_2O_3$ with an approximate density of 7.62 g/cm$^3$ and $Yb_2O_3$ with an approximate density of 9.25 g/cm$^3$ produces $Sm_{1.1}$ $Yb_{0.9}O_3$ with an approximate mixture density of 8.34 g/cm$^3$. Such mixture density substantially matches the density of the Pb—Sn eutectic solder material.

Also, since the density of various rare earth oxides range from 5.03 g/cm$^3$ for $Y_2O_3$ to 9.423 g/cm$^3$ for $Lu_2O_3$, mixtures of such oxides and/or mischmetal oxides including mixed rare earth oxides containing La, Ce and Pr, are useable for the dispersoid particles 110 for achieving a desired density. Other oxides such as transition metal or refractory metal oxides including NbO, $ZrO_2$, $H_fO_2$, and $Ta_2O_3$ having approximate densities of 7.3, 5.8, 9.68 and 8.02 g/cm$^3$, respectively, or combinations of such oxides are also useable for providing a desired density. Alternatively, refractory metal borides, carbides or their combinations are further useable for producing dispersoid particles having a desired density including, for example, $HfB_2$, TaB, $TaB_2$, $ZrB_2$, HfC, TaC, WC, TiC, ZrC and TiC having approximate densities of 11.2, 14.0, 12.4, 6.1, 12.2, 14.7, 15.7, 6.7 and 4.25 g/cm$^3$, respectively.

Further, density matching of lead-rich solders such as conventional 95% Pb-5% Sn (wt %) solder alloy have a relatively large approximate density of 11.00 g/cm$^3$ can be accomplished using the previously listed relatively large density borides or carbides as a component for the dispersoid particles 110. If the melting and solidification times of the solder material are sufficiently short, then lead-containing materials are useable as a component of the dispersoid particles for achieving a desired density. Examples of such lead-containing materials include, PbO, $PbF_2$, $PbTiO_3$, $PbZrO_3$ or combinations of such lead containing materials such as Pb $(Ti_{0.46}Zr_{0.54})$ $O_3$.

Although dispersoid particles and solder materials having matching densities substantially inhibit segregation of the particles in the resulting solder joint, it is also possible to use dispersoid particles and solder materials having different densities according to the invention. However, in producing a dispersoid-containing mixture according to the method 1 for such instances, the use of particular amount of liquid during wet mixing provides a sufficient desired viscosity or inter-particle friction in the mixture to inhibit segregation.

For instance, it is possible to achieve a desirable viscosity employing 10% to 40% by volume of liquid for a conventional gentle mechanical mixing process such as string. Relatively higher power mixing methods such as mechanical alloying using speed attrition mills or ball milling and associated plastic deformation are also useable. However, such mixing methods have relatively high processing cost and can, in particular instances, undesirably cause agglomeration of the dispersoid or solder particles.

After wet mixing, the mixed powder aggregate is then dried to remove liquid medium. The drying process can be carried out either in ambient, in an inert atmosphere such as nitrogen or argon, or in vacuum. The dried powder aggregate is plastically deformed by mechanical compression, in step 20 of FIG. 1, to form the dispersoid-containing solder sheet 120, as shown in the sequence of FIGS. 2B and 2C. The dispersoid-containing solder sheet 120 has a thickness, for example, in the range of 250 $\mu$m to 1 mm.

The mechanical compression step 20 is advantageously performed in a vacuum or inert gas environment. Such an environment reduces the amount of trapped air in such pores that undesirably cause oxidation in internal surfaces and expansion or bubbling of the gas during intermediate or final heat treatment. Also, it is possible to use hydraulic press compacting or other mechanical compression techniques for step 20.

In step 20, an advantageous dispersion of the particles 110 is achieved by sufficient compression to produce an inter-particle distance between solder particles 100 in the compression direction to at most ten times the average diameter of the dispersoid particles 110, and preferably to at most three times the dispersoid diameter as shown in the compression sequence of FIGS. 2B and 2C. Accordingly, it is advantageous to achieve a plastic deformation of at least 50% reduction in thickness of the solder composition aggregate. Such plastic deformation advantageously reduces spacing between effective layers of dispersoid particles 110 surrounding each flattened Pb—Sn solder particle 100 diameter as shown in the compression sequence of FIGS. 2B and 2C. Thus, an even greater advantage is achievable using a plastic deformation of at least 90% to 95% reduction in thickness of the solder composition aggregate. The deformation does not have to be uni-axial in nature. It could be a repeated pressing/expanding process in any direction in a manner substantially similar to, for example, the mixing of flower in dough prior to baking.

In large-scale, continuous industrial manufacturing, it is possible to use conventional metals mill processing using plates and strips for the mechanical compression in step 20 of FIG. 1. In such instance, a press-compacted preform is produced from a press-compacted dispersoid-containing solder composition aggregate. The preform is then subjected to cold or warm rolling into continuous strips which are wound into coils. Swaging into rods followed by wire drawing or roll flattening is also useable. It is optionally possible in step 20 to shear the resulting plates or strips into sections that are stacked and rolled at least once to further improve dispersion of the dispersoid particles in the composition.

Figure 3:
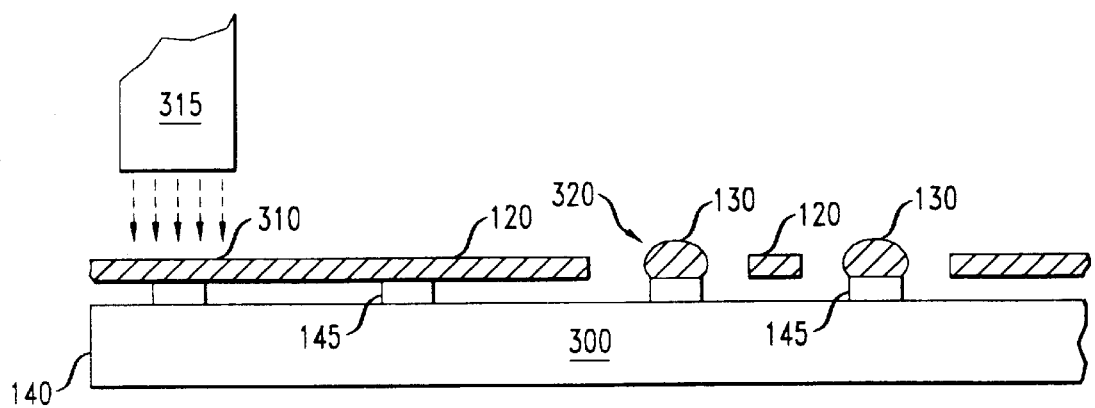
FIG. 3 is a schematic diagram illustrating an exemplary method for producing solder bumps from a dispersoid-containing solder sheet in accordance with the method of FIG. 1.

After a dispersoid-containing solder sheet 120 is formed in step 20 of FIG. 1, the sheet 120 is used, in step 30, to form solder bumps 130 on, for example, contact pads 145 of the first component 140 as shown in FIG. 3. If the densities of the dispersoid particles and the solder material are substantially similar, then the particular method used for forming the solder bumps 130 is not critical to practicing the invention because undesirable segregation of the dispersoid particles would not likely occur during melting. However, if densities of the dispersoid particles and the solder material are not substantially similar, then a solder bump forming method that limits segregation of the dispersoid particles should be used. Exemplary techniques that limit such segregation include the laser beam melting or pressure bonding techniques depicted in FIGS. 3 and 4, respectively.

The laser beam melting technique uses relatively rapid heating of, for example, greater than approximately 20° C./sec and more advantageously greater than 100° C./sec, and corresponding rapid cooling of more than 10° C./sec and more advantageously 50° C./sec to form the solder bumps 130 substantially without segregation of the dispersoid particles. In FIG. 3, the dispersoid-containing solder sheet 120 formed according to step 20 of FIG. 1 is placed over a portion of a contact pads 145 on a substrate 300 of a first component 140. Particular regions 310 of the sheet 120 proximate each contact pad 145 is then rapidly heated using light energy from a laser 315 to melt the solder in such regions forming the solder bumps 130 as shown at the region 320. After the solder bumps 130 are formed, the remaining solder sheet 120 can be removed from the substrate 300 by, for example, mechanical or vacuum methods, and recycled for subsequent soldering operations.

To achieve enhanced wetting, a suitable solder flux such as, rosin-mildly-activated (RMA) fluxes is optionally applied to the contact pads 145 or the solder sheet surface contacting such contact pads prior to laser melting. The respective solder sheet regions 310 can be melted by the laser light energy sequentially or simultaneously in accordance with the invention. Further, it is advantageous to melt regions 310 that are approximately 5% to 20% larger in area than the contact pads 145 because the corresponding effects of the wetting by the contact pads 145 facilitates separation of the melted solder from the sheet 120. After formation of the solder bumps 130 on the first component 140 in step 30 of FIG. 1, solder joints 150 can be produced between the first component 140 and another component are formed by, for example, a conventional reflow process.

Figure 4:
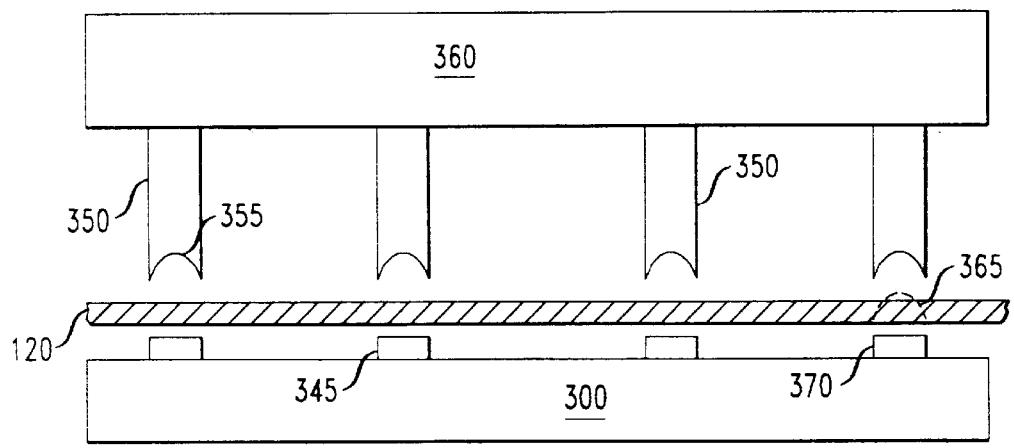
FIG. 4 is a schematic diagram illustrating an alternative method for forming solder bumps to the method of FIG. 3.

The solder bumps 130 are also formable from the solder sheet 120 according to the invention using an exemplary pressure bonding technique, shown in FIG. 4. Similar components in FIGS. 3 and 4 are like numbered for consistency, such as the substrate 300 and contact pads 145. In FIG. 4, the dispersoid-containing solder sheet 120 is provided over the contact pads 145. Then, at least one punch pin 350 of a pressing device 360 punches out particular regions of the solder sheet 120 that are then pressure bonded by the pin 350 to the contact pad 145 to form the solder bumps. A dashed outline 365 indicates the shape of a corresponding solder bump that would be produced on the contact pad 370 by this pressure bonding process. It is possible to form solder bumps having, for example, an average diameter in the range of 5 to 50 mils.

Ends 355 of the punch pins 350 have a shape, such as substantially concave, that facilitates pressure bonding and formation of the solder bump 130 having the desired shape. Solder non-wetting materials such as stainless steel are useable for the punch pins 350. In the alternative, the punch pin ends 355 can be coated with a solder non-wetting material, such as Teflon or a diamond film. It is advantageous to anneal the solder sheet at a temperature, for example, in the range of $0.5T_M$ to $0.8T_M$, where $T_M$ is the solder melting point temperature, prior to pressure bonding to facilitate punching, shaping and bonding of the dispersoid-containing Pb—Sn solder sheet. It is possible to anneal the solder sheet at other temperature ranges and different times based on the material of the solder sheet to achieve the desired pressure bonding characteristics.

Enhanced pressure bonding is achievable with the use of punch pins 350 having a higher temperature relative to the solder sheet 120, such as, on the order of 100° C. to 150° C. for eutectic Pb—Sn solders. Also, it is advantageous to coat the contact pads with a suitable material, such as Pb—Sn or Sn, before the pressure bonding process to facilitate adhesion of the solder bumps 130. It is also possible to coat the contact pads or the surface of the solder sheet facing such contact pads with solder flux to facilitate wetting.

Although the previously described methods produced solder joints 150 from a solder sheet 120 using powdered solder, it is alternatively possible to form the dispersoid-containing solder sheet 120 using a variety of other methods according to the invention. For instance, it is possible to produce such solder compositions using a lamination-dispersion method. Such a lamination-dispersion method facilitates large scale industrial manufacturing of the dispersion-containing solder compositions and articles using such solders. Further, such a lamination-dispersion process can typically be performed at lower cost relative to solder powder processes due to the use of typically lower cost bulk solder materials instead of fine solder powders, and without the higher handing costs associated with lead-containing powders in avoiding undesirable surface oxidation and health/environmental risks.

Figure 5:
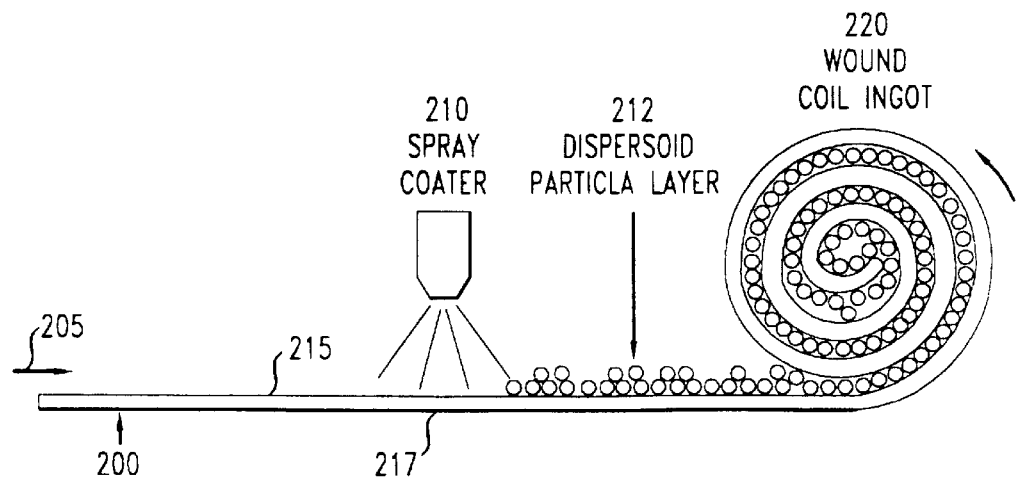
FIG. 5 is a schematic diagram illustrating an alternative method to the method of FIG. 1 for forming the dispersoid-containing solder using a dispersion-lamination process.

An exemplary lamination-dispersion process is illustrated in FIG. 5. Such a process substantially performs the steps of the method 1 of FIG. 1, but substitutes a lamination-dispersion process for the powder mixing step 10. In FIG. 5, a solder sheet 200, such as a Pb—Sn solder sheet, is moved in a direction indicated by arrow 205 proximate a sprayer 210 that sprays dispersoid particles 212 of the desired material and average particle diameter on to a surface 215 of the sheet 200. The amount of the dispersoid particles coated on the solder sheet 200 should correspond to the desired volume fraction of the dispersoid in the resulting solder composition. A useable solder sheet thickness for Pb—Sn solders is, for example, on the order of 0.005 to 0.250 inches, and more advantageously in the range of 0.010 to 0.100 inches. After the solder sheet 200 is coated, it is rolled into an ingot-like preform 220 in accordance with step 20 of FIG. 1.

Although a single surface 215 of the sheet 200 is spray coated, it is alternatively possible to further spray coat the opposite surface 217 according to the invention. A conventional spray coating operation is useable for spraying the dispersoid particles in a liquid medium carrier, such as alcohol, acetone or water. It is desirable to clean the surfaces 215 and 217, mechanically or chemically, prior to dispersoid coating to remove undesirable contaminates such as grease and dirt or to remove a formed oxide skin. Such clean surfaces facilitate dispersoid-to-sheet adhesion, and sheet-to-sheet bonding.

Although a sprayer is used in FIG. 5 for coating the solder sheet 200, numerous other methods can be used to coat the sheet 200 with dispersoid particles. For example, dip coating by submerging the solder sheet 200 into a liquid medium bath containing the dispersoid particles and with or without a binder material. Also, brush painting, roller painting, electrophoretic or electrostatic attachment of wet or dry dispersoid particles are useable for coating the solder sheet 200. If a liquid medium or binder is employed during the coating process, the coated sheet should be dried prior to the subsequent mechanical compression step.

In commercial production, it is possible for the coiled preform 220 to have a weight on the order of 100–10,000 pounds and a diameter on the order of one to three feet. In the alternative, sections of the coated sheet can be cut, stacked and press bonded to form a rectangular block preform having, for example, 10 to 10,000 layers. The formed preform is then mechanically compressed in a step corresponding to step 20 of FIG. 1. Cold or warm rolling are useable for the mechanical compression to reduce the interlayer distance and reducing the distance between layers of the dispersoid particles. In the alternative, a plurality of smaller number of stacked or rolled layers can be employed for forming the preform 200, by repeatedly cold rolling and restacking to achieve the dispersion of the dispersoid particles. Intermediate heat treating steps, such as at a temperature of $0.5T_M$ to $0.9T_M$ for 0.1 to 100 hours are useable to facilitate interlayer bonding and mechanical softening for the compression steps.

The preform 220 is compressed to achieve a desired distribution of the dispersoid particles. Accordingly, the required mechanical compression is dependent on the initial solder sheet thickness, size and amount of the dispersoid particles added, and the total thickness of the multi-layer preform. For instance, a typically reduction of approximately 5% to 20% deformation in thickness per rolling pass, for compression by cold or warm rolling, is useable to achieve an overall thickness reduction of approximately 99% to 99.99%. Accordingly, an approximately 25 cm thick preform stack or coil including 500 layers of solder sheets, each having a thickness of about 500 µm thick and coated with 25 μm to 50 μm thick of TiO$_2$ particles having an average diameter of 100 nm (about 5% by volume) is deformable by repeated cold or warm rolling to achieve a dispersion containing solder sheet of approximately 500 μm thick. Such a deformation corresponds to a 99.8% reduction from the original 25 cm thickness.

The resulting 500 μm thick dispersoid-containing solder sheet is again stacked or coiled to a 25 cm thickness or diameter and compressed to a 500 μm thickness again to achieve an overall reduction in the distance between dispersoid particle coating layers from 500 μm to approximately 0.002 μm, which is much smaller than the average diameter of the TiO$_2$ dispersoid particles. Since a substantially uniform three-dimensional distribution of 5% by volume of 100 nm-sized dispersoid particles is an average inter-particle distance on the order of 0.3 μm, the previously described process could achieve such a substantially uniform dispersoid particle distribution.

Moreover, the relatively severe plastic deformation caused by the rolling mechanical compression exposes fresh metal surfaces enabling relatively strong solder-to-solder interlayer bonding/adhesion for compression of subsequent restacked and coiled preforms. For additional bonding and integrity of the multi-layer lamination, intermediate heat treatment including partial or rapid melting, such as, for example, by induction heating of the stacked or coiled preform is optionally useable.

Although the previously described methods for producing solder bumps with respect to FIGS. 1A to 5 used a dispersoid-containing solder sheet, such sheet is not critical for practicing the present invention. For instance, it is possible to form dispersoid-containing solder bumps by dip-coating or wave-soldering coating using a molten dispersoid-containing solder bath. It is important to maintain the desirable distribution of the dispersoid particles in the molten solder during this solder bump forming operation. Dispersoid particles having densities that substantially match the solder material are useable for this purpose. Further, agitation of the dispersoid-containing solder bath is also useable for providing the desired particle distribution whether a density matching or non-matching dispersoid particles are employed. A sufficient amount agitation includes that typically used in conventional wave soldering baths.

Also, if the densities of the dispersoid particles and the solder material are substantially different it is desirable to provide relatively rapid cooling of more than approximately 10° C./sec and more advantageously 50° C./sec during dip-coating or wave-soldering coating to substantially inhibit segregation of dispersoid particles in the formation of the solder bumps 130.

Figure 6A:
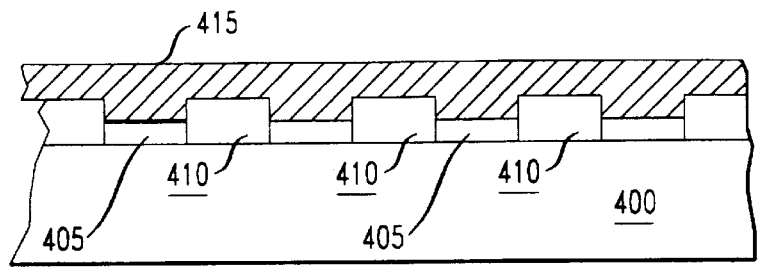
FIGS. 6A, 6B and 6C are schematic diagrams of another method for forming dispersoid-containing solder bumps in accordance with the invention.
Figure 6B:
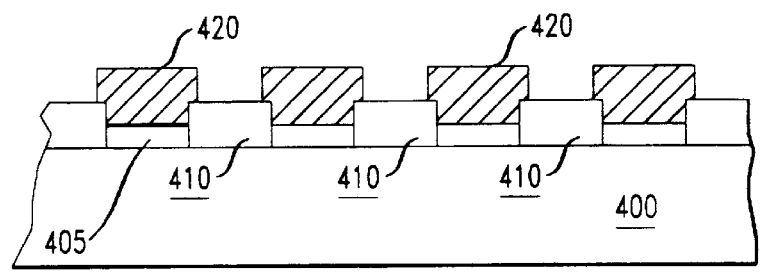
Figure 6C:
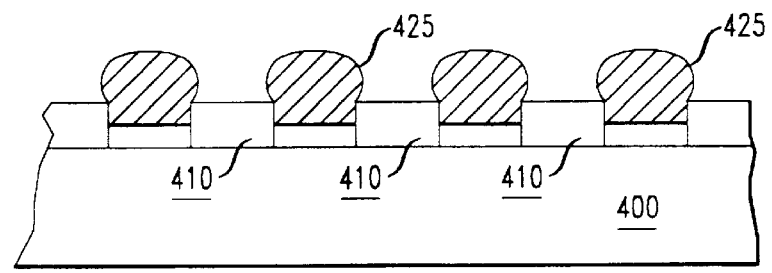

In the alternative it is possible to produce solder bumps covering areas of a component on the order of 2500 μm$^2$ or less according to the invention using deposition of a thin film dispersoid-containing solder layer and photolithographic removal. FIGS. 6A to 6C illustrate exemplary steps in accordance with this method.

In FIG. 6A, contact pads 405, such as copper or aluminum contact pads, are formed on a surface of a substrate 400, such as a silicon substrate. Those areas of the silicon substrate surface not containing contact pads are covered with a protective insulator 410 such as, for example, polyimide or an oxide layer, that does not wet a molten solder. Then, the contact pads 405 and insulator layer 410 are coated with a dispersoid-containing solder mixture having the desired compositional ratio to form layer 415. It is possible for the thickness, of the solder film layer 415 to be in the approximate range of 0.1 μm to 50 μm and more advantageously in the range 0.1 μm to 2 μm.

It is possible to accomplish such coating by co-sputtering from Pb—Sn and dispersoid targets or a combination of sputtering and evaporation of such materials. If an electrical insulator, such as oxide, boride or carbide, is used for the dispersoid, then RF sputtering rather than DC sputtering is useable for depositing such material. Further, if the dispersoid is an oxide, then it is possible to employ a residual oxygen gas in the deposition chamber atmosphere produce the desired oxide during the deposition process.

After the formation of the solder layer 415, portions of the layer 415 not proximate the contact pads 405 are removed, such as, for example, by etching using a conventional lithography process to form regions 420 of the solder film layer 415 proximate the contact pads 405 as depicted in FIG. 6B. Then, the substrate 400 and its layers are heated to reflow the solder layer regions 420. Due to wetting of the contact pads 405 and surface tension of the molten solder, the reflowed solder regions 420 tend to produce microsolder bumps 425 as shown in FIG. 6C.

Since conventional lithographic material removal techniques are useable for producing a micron-level resolution, high-density, micron-size solder bumps 425 are formable according to such technique. As a consequence, although this technique is useable for forming solder bumps covering a component area of approximately 2500 μm$^2$ or less, it is particularly advantageous for forming solder bumps covering component areas of approximately 25 μm$^2$ or less, and even more advantageously 4 μm$^2$ or less.

In accordance with an alternative embodiment of the invention, it is possible to produce the advantageous dispersoid-containing solder joints of the invention using a solder paste technique instead of the previously described solder bumps. Such solder pastes include the dispersoid-containing solder particles mixed with suitable fluxes and other chemicals. Is possible to form such solder pastes on a component for producing solder joints using conventional techniques employed with surface mount components including screen printing of the solder paste. After the paste is formed on a component, a mating component is properly aligned and positioned in contact with the solder paste, and a corresponding solder joint is formed by heating the components to reflow the solder.

It is possible to produce the dispersoid-containing solder powder material contained within the solder paste by mechanical scraping of alloy from solid, dispersoid-containing alloy blocks, followed by remelting and solidification of the scraped material suspended in a fluidized medium. In the alternative, a dispersoid-containing molten solder is atomizable to produce the dispersoid-containing solder powder.

Exemplary dispersoid-containing solder joints 150 produced in accordance with the invention between contact pads 145 of first and second components 140 and 500 are shown in FIG. 7. Such solder joints advantageously maintain a sub-micron grain size that enhances the fatigue life of the solder joint due to thermal and stress cycling by exhibiting a level of superplasticity. Also, shown in FIG. 7 are spacers 520 that limit the extent of deformation due to compression force applied to either of the components 140 and 500. Accordingly, an undesirable over-spreading of the solder-joint 150 due to its superplasticity is advantageously restrained. In a similar manner, lateral or tensile deformation can be restrained by using a pin-in-a-hole type configuration. In such a configuration, a pin or protrusion attached to one of the components extends into a hole in the other component. Such a configuration limits the lateral movement of the components relative to one another as the pins relative movement is limited by the component surfaces forming the hole.

In the following examples, dispersoid-containing solders are formed having an advantageously fine average solder grain diameter of 5 nm to 2000 nm to achieve a level of superplasticity providing an improved solder joint strength of at least 30% to 50% relative to a corresponding composition without dispersoid particles and a corresponding improvement of fatigue life of at least 50% to 100%.

EXAMPLE 1

A mixture of Pb—Sn eutectic solder powder having an average particle diameter of approximately 50 μm was wet mixed with a $Al_2O_3$ dispersoid particles having an average particle diameter of 10 nm using ethyl alcohol. The $Al_2O_3$ dispersoid particles made up approximately 2% by volume of the mixture. The composite was dried, pressed for consolidation, annealed at 120° C., and repeatedly plastically deformed and annealed to achieve an overall reduction in thickness of greater than $1/10^4$. The resulting solder sheet was then annealed at 120° C. for 3 hours and 48 hours, respectively, to produce the microstructures shown in FIGS. 8A and 8B. The 120° C. corresponds to a high homologous temperature of 0.86 $T_m$, wherein the melting temperature of the eutectic Pb—Sn solder is 183° C.

Figure 8A:
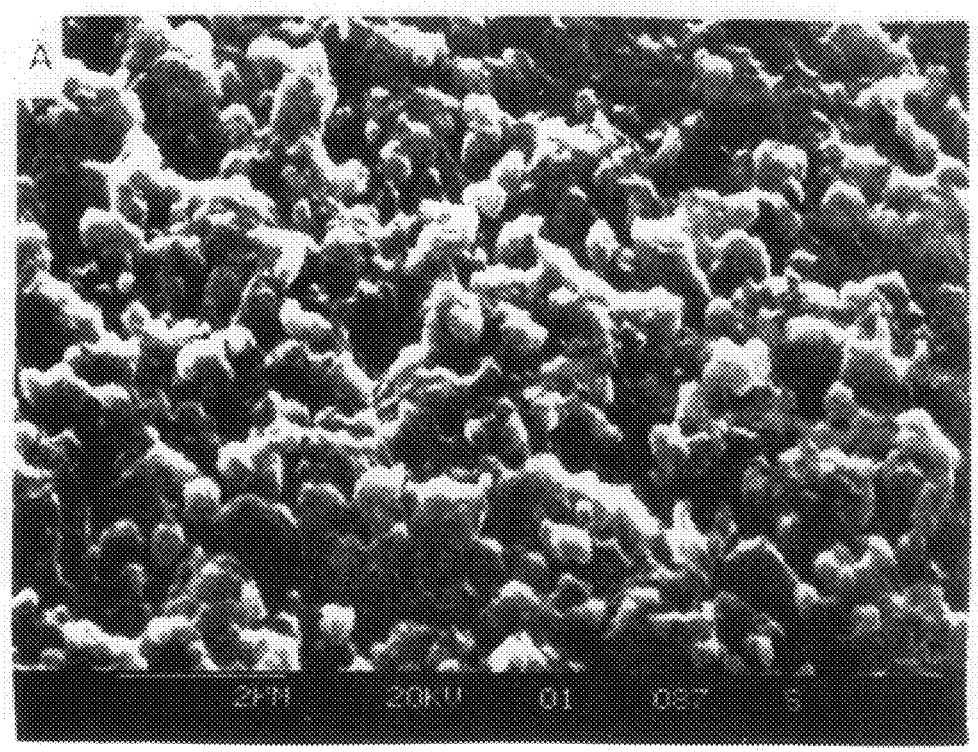
FIGS. 8A and 8B are micrographs of a solder compositions according to the invention.
Figure 8B:
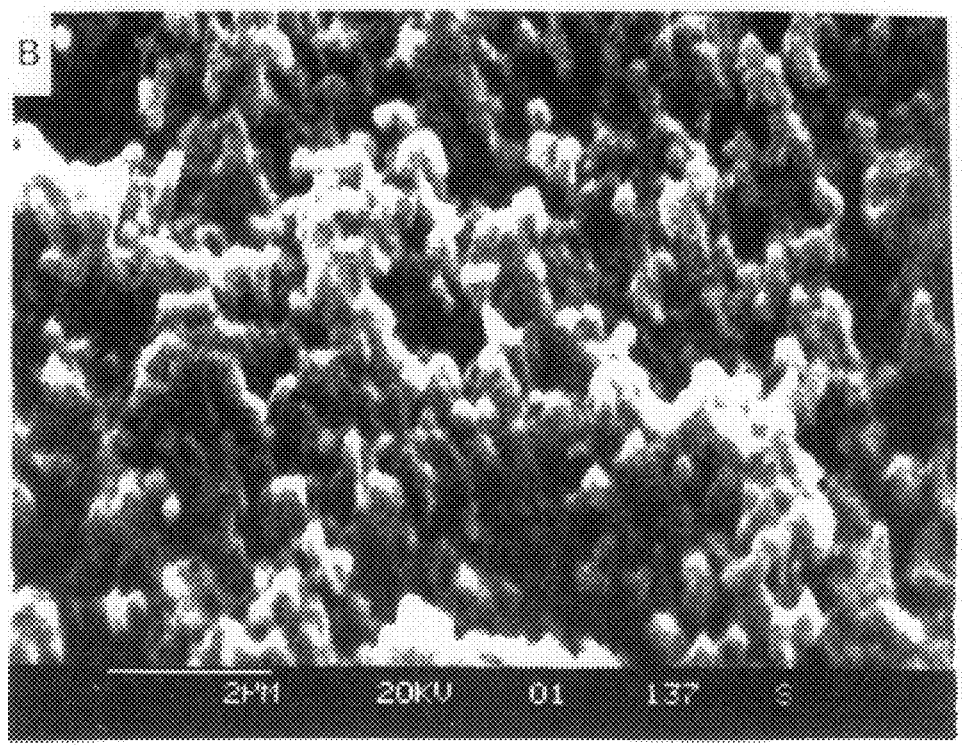
Figure 9A:
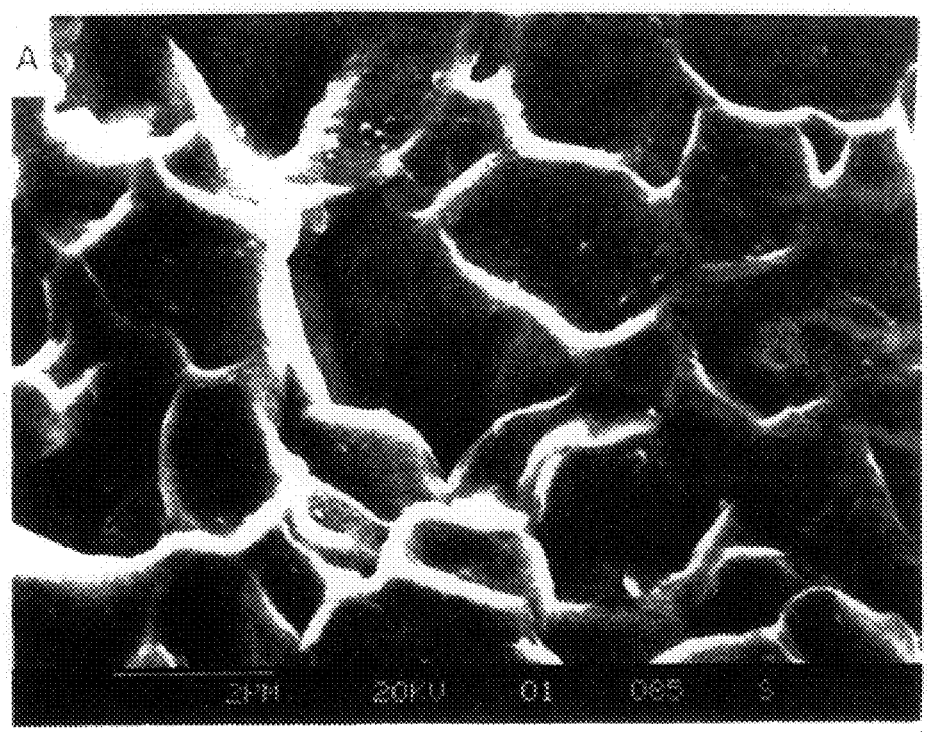
FIGS. 9A and 9B are micrographs of conventional solder alloys.
Figure 9B:
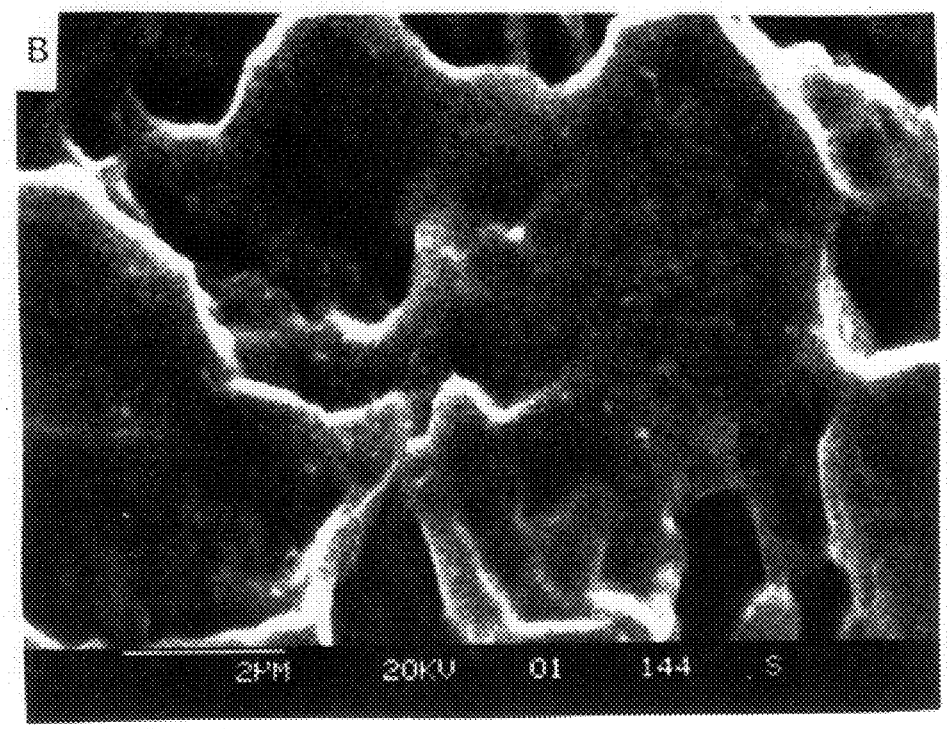

In FIG. 8A, after the annealing at 120° C. for 3 hours, the average grain diameter is approximately 200 nm using a linear intercept technique. The average grain diameter after annealing at 120° C. for 48 hours is advantageously approximately the same 200 nm. In comparison, the same annealing at 120° C. for 3 and 48 hours was applied to a corresponding Pb—Sn sheet without dispersoid particles which produced the microstructures shown in FIGS. 9A and 9B, respectively. The microstructure shown in FIG. 9A possesses and average grain diameter of approximately 2 μm which disadvantageously coarsens to 5 to 6 μm after 48 hours of annealing as shown in FIG. 9B.

EXAMPLE 2

Another solder alloy according to the invention was similarly prepared and processed as in EXAMPLE 1 except a dispersoid particles of $Al_2O_3$ having an average diameter of approximately 200 nm was used. A corresponding resulting advantageous average grain diameter of 500 nm and 600 nm were produced by annealing at 120° C. for 2 and 48 hours, respectively. Such fine grain diameters represent a substantial improvement over the grain diameters of the conventional Pb—Sn solder alloy shown in FIGS. 9A and 9B.

Although several embodiments of the invention have been described in detail above, many modifications can be made without departing from the teaching thereof. All of such modifications are intended to be encompassed within the following claims. For example, although the previously described embodiments concern the use of Pb—Sn solder alloys, it should be readily understood that lead-free solders such as, for example, Sn—Ag, Bi—Sn and In—Ag based solders are useable to form dispersoid-containing solder joints in accordance with the invention.

The invention claimed is:

1. A process for forming a solder article, comprising the steps of:

providing metallic solder particles;

mixing dispersoid particles with the solder particles such that the dispersoid particles at least partially coat the surface of the solder particles, wherein the dispersoid particles are substantially inert relative to the solder particles and wherein the dispersoid particles have an average diameter at least one order of magnitude less than the average diameter of the solder particles; and subjecting the mixture to plastic deformation to at least a 50% reduction in thickness, such that the distribution of the dispersoid particles in the mixture is made more uniform.

2. The process of claim 1, wherein the dispersoid particles have an average diameter of 5 nm to 2000 nm.

3. The process of claim 1, wherein the dispersoid particles have an average diameter of 5 nm to 500 nm.

4. The process of claim 1, wherein the dispersoid particles are selected from the group consisting of oxides, carbides, and nitrides.

5. The process of claim 1, wherein the solder particles comprise 30 to 98 wt. % Pb, and 2 to 70 wt. % Sn.

6. The process of claim 1, wherein the solder article exhibits an average grain diameter of 500 nm or less.

7. The process of claim 1, wherein the solder article comprises 0.5 to 20 vol. % dispersoid particles.

8. The process of claim 1, wherein the dispersoid particles have an average density within 10% of an average density of the solder particles.

* * * * *